(12) United States Patent
Kitagawa et al.

(10) Patent No.: US 12,348,006 B2
(45) Date of Patent: Jul. 1, 2025

(54) SEMICONDUCTOR DEVICE AND METHOD FOR MANUFACTURING SEMICONDUCTOR DEVICE

(71) Applicant: Mitsubishi Electric Corporation, Tokyo (JP)

(72) Inventors: Motoshi Kitagawa, Tokyo (JP); Kazumasa Kishimoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 652 days.

(21) Appl. No.: 17/756,249

(22) PCT Filed: Mar. 16, 2020

(86) PCT No.: PCT/JP2020/011431
§ 371 (c)(1),
(2) Date: May 19, 2022

(87) PCT Pub. No.: WO2021/186497
PCT Pub. Date: Sep. 23, 2021

(65) Prior Publication Data
US 2022/0416511 A1    Dec. 29, 2022

(51) Int. Cl.
*H01S 5/227*      (2006.01)
*G02F 1/017*      (2006.01)
(Continued)

(52) U.S. Cl.
CPC ........ *H01S 5/2275* (2013.01); *G02F 1/01708* (2013.01); *G02F 1/212* (2021.01);
(Continued)

(58) Field of Classification Search
CPC .. H01S 5/04257; H01S 5/2213; H01S 5/2275; G02F 1/0178; G02F 1/212; G02F 1/2213; G02F 1/2257
See application file for complete search history.

(56) References Cited

U.S. PATENT DOCUMENTS

| | | |
|---|---|---|
| 4,487,652 A | 12/1984 | Almgren |
| 5,940,732 A | 8/1999 | Zhang |

(Continued)

FOREIGN PATENT DOCUMENTS

| | | | |
|---|---|---|---|
| JP | S60-208838 A | 10/1985 | |
| JP | S61-059735 A | 3/1986 | |

(Continued)

OTHER PUBLICATIONS

International Search Report issued in PCT/JP2020/011431; mailed Jun. 23, 2020.

*Primary Examiner* — Michael Carter
(74) *Attorney, Agent, or Firm* — Studebaker Brackett PLLC

(57) ABSTRACT

A laminate (22) is formed on a semiconductor substrate (10). Two or more grooves (54) are formed in the laminate (22). A mesa (24) with two grooves among the two or more grooves (54) positioned on both sides is formed. An insulating resin film (30) is embedded into the two or more grooves (54). A first opening (32) is formed at the insulating resin film (30) embedded in one of the two or more grooves (54) and an electrode (46) extracted upward from a bottom surface (36) is formed. A first side surface (34) of the insulating resin film (30) is inclined in a forward tapered direction.

8 Claims, 14 Drawing Sheets

(51) Int. Cl.
  *G02F 1/21*   (2006.01)
  *G02F 1/225*  (2006.01)
  *H01S 5/042*  (2006.01)
  *H01S 5/22*   (2006.01)
  *H01S 5/343*  (2006.01)

(52) U.S. Cl.
  CPC ........ *G02F 1/2257* (2013.01); *H01S 5/04257* (2019.08); *H01S 5/2213* (2013.01); *H01S 5/34313* (2013.01); *G02F 2201/063* (2013.01); *G02F 2202/101* (2013.01); *G02F 2202/102* (2013.01)

(56) References Cited

U.S. PATENT DOCUMENTS

| | | | | |
|---|---|---|---|---|
| 6,360,048 | B1 * | 3/2002 | Yamada | H01S 5/04256 372/50.1 |
| 2002/0137245 | A1 * | 9/2002 | Kitamura | H01S 5/04257 438/22 |
| 2014/0021160 | A1 * | 1/2014 | Kitamura | G02F 1/2257 216/2 |
| 2016/0284876 | A1 | 9/2016 | Yagi | |

FOREIGN PATENT DOCUMENTS

| | | |
|---|---|---|
| JP | H7-135369 A | 5/1995 |
| JP | 2010-087233 A | 4/2010 |
| JP | 2011-238956 A | 11/2011 |
| JP | 2014-038322 A | 2/2014 |
| JP | 2016-184680 A | 10/2016 |
| WO | 2017/212888 A1 | 12/2017 |

* cited by examiner $C_3F_8/O_2 = 5/25$ sccm ($O_2$: 83 %)

SEMICONDUCTOR DEVICE AND METHOD FOR MANUFACTURING SEMICONDUCTOR DEVICE

FIELD

The present disclosure relates to a semiconductor device and a method for manufacturing the semiconductor device.

BACKGROUND

To cause an optical semiconductor device such as a semiconductor laser to perform high-speed operation, it is important to reduce parasitic capacitance of electrodes. The parasitic capacitance increases if two electrodes are positioned so as to face each other. This increase in the parasitic capacitance hinders high-speed operation.

To reduce parasitic capacitance of electrodes, a surface-mounted semiconductor laser is used. In the surface-mounted semiconductor laser, two electrodes are formed on the same plane side. In other words, the two electrodes do not face each other. Thus, the parasitic capacitance of the electrodes can be reduced.

In the surface-mounted semiconductor laser, an electrode to be extracted from a lower side is extracted to the top along an opening that is dug from an upper surface. In the semiconductor laser, a current flows perpendicularly to a substrate at a light emitting part, and thus, an electrode on a lower side requires to be extracted from a portion near the substrate to the top in the surface-mounted semiconductor laser. To achieve this structure, an electrode connected at the bottom of the opening is extracted to the top.

If an angle of side surface of the opening becomes steep, peeling or disconnection of the electrode is more likely to occur. There is a portion where the electrode bends while the electrode is extracted from the bottom surface of the opening to the top. If the angle of the side surface of the opening is steep, a bending angle also becomes steep. The steep bending angle makes peeling or disconnection of the electrode more likely to occur.

A surface-mounted semiconductor laser in which an angle of a side surface of an opening is not steep is disclosed (see, for example, PTL 1). The semiconductor laser disclosed in PTL includes a high-resistance semiconductor buried layer on right and left sides of a mesa including a light emitting part. An opening is provided at this high-resistance semiconductor buried layer, and an electrode is extracted. A side surface that is in contact with the opening, of the high-resistance semiconductor buried layer is formed to have an angle of approximately 70° by utilizing characteristics of a MOVPE method.

CITATION LIST

Patent Literature

[PTL 1] JP H7-135369 A

SUMMARY

Technical Problem

There is a case where an effect of reduction in parasitic capacitance is not sufficient in the semiconductor laser described above. Such a semiconductor laser includes a high-resistance semiconductor buried layer which has relatively high permittivity and which is embedded on both sides of a mesa, and thus, there is a possibility that the parasitic capacitance of the electrodes cannot be sufficiently reduced.

The present disclosure has been made to solve the above-described problem, and an object thereof is to obtain a semiconductor device that achieves reduction in parasitic capacitance of electrodes and makes peeling and disconnection of the electrodes less likely to occur, and a method for manufacturing the semiconductor device.

Solution to Problem

A semiconductor device according to the present disclosure includes a semiconductor substrate, a laminate formed on the semiconductor substrate and including a first conductive type clad layer as a lowermost layer and a second conductive type clad layer as an uppermost layer, two or more grooves that are dug halfway to the first conductive type clad layer from an upper surface of the second conductive type clad layer being formed in the laminate, a mesa including a ridge waveguide including the first conductive type clad layer, an active layer and the second conductive type clad layer sequentially from a side closer to the semiconductor substrate, two grooves among the two or more grooves being positioned on both sides of the mesa and an insulating resin film embedded into the two or more grooves, wherein a first opening having a bottom surface from which the first conductive type clad layer is exposed is formed at the insulating resin film embedded in one of the two or more grooves, an electrode connected to the first conductive type clad layer on the bottom surface and extracted above the insulating resin film along a first side surface that is in contact with the first opening, of the insulating resin film is formed, and the first side surface is inclined in a forward tapered direction.

A method for manufacturing a semiconductor device according to the present disclosure includes a step of sequentially forming a first conductive type clad layer, an active layer and a second conductive type clad layer on a semiconductor substrate, a step of forming two or more grooves by performing etching halfway to the first conductive type clad layer from an upper surface of the second conductive type clad layer to form a mesa including a ridge waveguide including the first conductive type clad layer, the active layer and the second conductive type clad layer from a side closer to the semiconductor substrate, two grooves among the two or more grooves being positioned on both sides of the mesa, a step of forming an insulating resin film to be embedded into the two or more grooves, a step of forming an insulating film on the insulating resin film and the second conductive type clad layer, a step of forming a second opening by etching the insulating film on the insulating resin film embedded into one groove among the two or more grooves and tilting a second side surface that is in contact with the second opening, of the insulating film in a forward tapered direction, a step of forming a first opening by etching the insulating resin film under the second opening using the insulating film as a mask so that the first conductive type clad layer is exposed and tilting a first side surface that is in contact with the first opening, of the insulating resin film in a forward tapered direction and a step of forming an electrode connected to the first conductive type clad layer on a bottom surface of the first opening and extracted above the insulating resin film along the first side surface.

Advantageous Effects of Invention

According to a semiconductor device and a method for manufacturing the semiconductor device of the present disclosure, an insulating resin film is embedded in grooves on both sides of a mesa, and an electrode is extracted from an opening at the insulating resin film to the top. Further, a side surface that is in contact with the opening, of the insulating resin films is inclined in a forward tapered direction. It is therefore possible to obtain a semiconductor device that achieves reduction in parasitic capacitance of electrodes and makes peeling and disconnection of the electrodes less likely to occur.

DESCRIPTION OF EMBODIMENTS

First Embodiment

Figure 1:
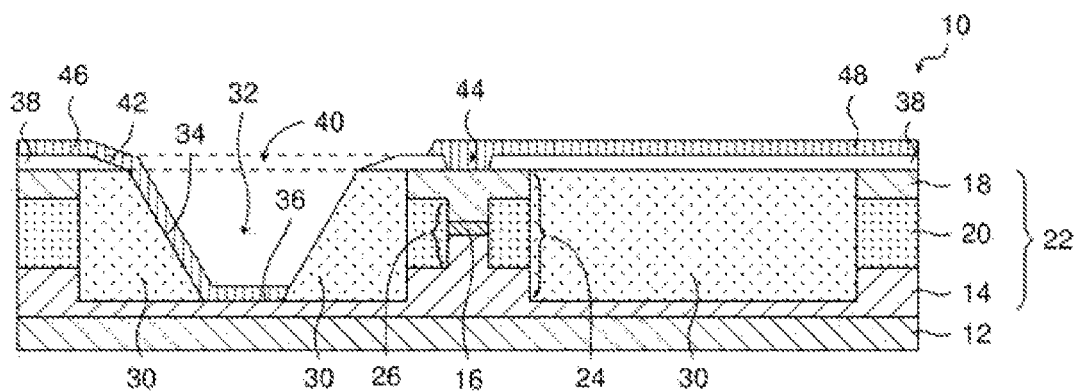
FIG. 1 is a cross-sectional diagram describing the semiconductor device according to the first embodiment.

A configuration of a semiconductor device according to the first embodiment will be described. The semiconductor device according to the first embodiment is a semiconductor laser 10 illustrated in FIG. 1. FIG. 1 is a cross-sectional diagram including a plane perpendicular to a resonator direction of the semiconductor laser 10.

The semiconductor laser 10 includes a semiconductor substrate 12. The semiconductor substrate 12 is, for example, a semi-insulating substrate including InP.

A first conductive type clad layer 14 is formed on the semiconductor substrate 12. The first conductive type clad layer 14 includes, for example, n-type InP. Impurity concentration of a portion connected to an electrode 46 among the first conductive type clad layer 14 may be made higher to decrease electric resistance.

A ridge waveguide 26 is formed, in which the first conductive type clad layer 14, an active layer 16 and a second conductive type clad layer 18 are formed sequentially from the bottom. The active layer 16 includes, for example, a multiple quantum well structure including i-type AlGaInAs. Here, the i type refers to a semiconductor to which intended doping is not applied. The second conductive type clad layer 18 includes, for example, p-type InP.

A current block layer 20 is embedded on right and left sides of the ridge waveguide 26. The current block layer 20 includes, for example, Fe—InP (Inp doped with Fe).

The second conductive type clad layer 18 is further formed on the ridge waveguide 26 and the current block layer 20.

A mesa 24 constituted with the first conductive type clad layer 14, the ridge waveguide 26, the current block layer 20 and the second conductive type clad layer 18 is formed. The mesa 24 has, for example, a width of 4.0 µm to 10.0 µm and a height of 6.0 to 8.0 µm.

Grooves 54 are, formed at a laminate 22 constituted with the first conductive type clad layer 14 as a lowermost layer and the second conductive type clad layer 18 as an uppermost layer. Positions of the grooves 54 are illustrated in FIG. 2(e) that illustrates a manufacturing process. The grooves 54 are dug on the both sides of the mesa 24. The grooves 54 are formed halfway to the first conductive type clad layer 14 from an upper surface of the second conductive type clad layer 18.

An insulating resin film 30 is embedded in the grooves 54. The insulating resin film 30 includes a benzocyclobutene (BCB) resin, a polyimide resin, or the like that has low permittivity and excels in embedded flatness.

A first opening 32 is open at the insulating resin film 30 on one of the both sides of the mesa 24. The first conductive type clad layer is exposed from a bottom surface 36 of the first opening 32. A side surface (first side surface 34) that is in contact with the first opening 32, of the insulating resin film 30 is inclined in a forward tapered direction so that the insulating resin film expands toward the semiconductor substrate 12. An angle c formed by the first side surface 34 and a lower surface of the insulating resin film 30 is equal to or greater than 20° and equal to or less than 60°.

An insulating film 38 is formed on the insulating resin film 30 and the second conductive type clad layer 18. A second opening 40 is formed at the insulating film 38 so as to be continuous with the first opening 32. FIG. 1 indicates a position of the second opening 40 with a dashed line. A side surface (second side surface 42) that is in contact with the second opening 40, of the insulating film 38, that is, the second side surface 42 that is continuous with the first side surface 34, of the insulating film 38 is inclined in the forward tapered direction. The insulating film 38 is constituted with, for example, a silicon oxide film.

An electrode 46 that is connected to the first conductive type clad layer 14 on the bottom surface 36 and extracted onto the insulating film 38 along the first side surface 34 and the second side surface 42 is formed. The electrode 46 includes, for example, a laminate structure of Ti/Pt/Au.

An electrode 48 connected to the second conductive type clad layer 18 through a third opening 44 that is open at the insulating film 38 on the mesa 24 is formed. The electrode 48 includes, for example, a laminate structure of Ti/Pt/Au.

A method for manufacturing the semiconductor laser 10 will be described using FIG. 2 to FIG. 4.

Figure 2A:
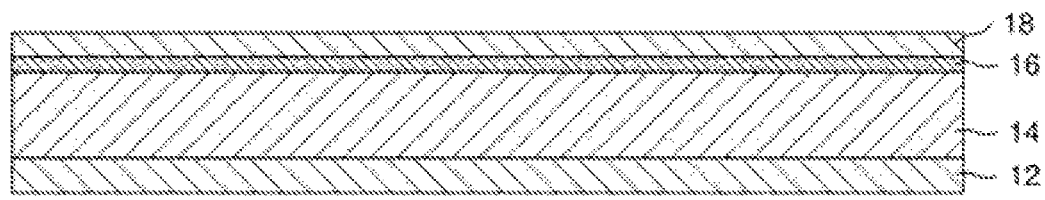
FIGS. 2A-2E, 3A-3E and 4A-4D are cross-sectional diagrams to describe the method for manufacturing the semiconductor device according to the first embodiment.

First, as illustrated in FIG. 2(a), the first conductive type clad layer 14, the active layer 16 and the second conductive type clad layer 18 are sequentially formed on the semiconductor substrate 12. These are formed by being epitaxially grown.

Figure 2B:
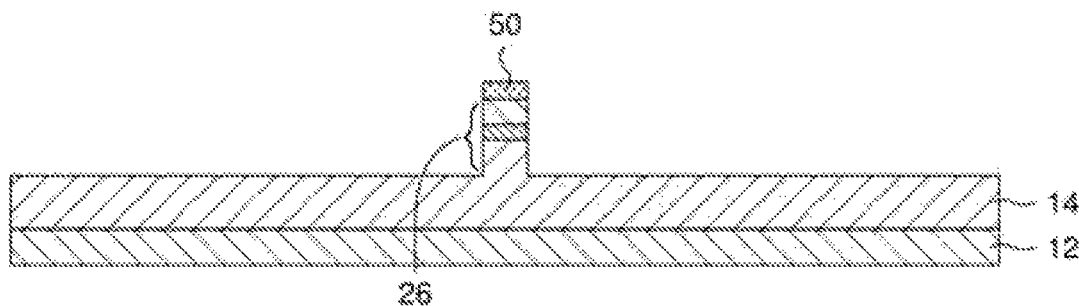

Then, as illustrated in FIG. 2(b), the ridge waveguide 26 is formed. To form the ridge waveguide 26, first, a mask 50 having a stripe pattern constituted with a silicon oxide film is formed. Then, dry etching is performed using the mask 50 as an etching mask. In this event, etching, is performed halfway to the first conductive type clad layer 14.

Figure 2C:
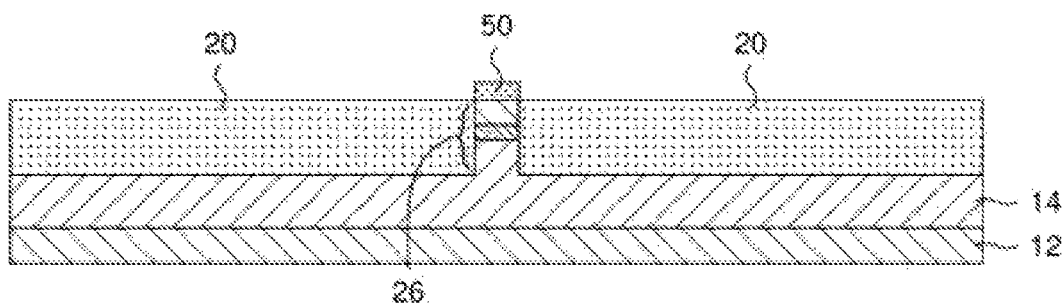

Then, as illustrated in FIG. 2(c), the right and left sides of the ridge waveguide 26 are embedded with the current block layer 20. To embed with the current block layer 20, selective epitaxial growth using the mask 50 is performed. In this event, the current block layer 20 is embedded to an upper surface of the ridge waveguide 26.

Figure 2D:
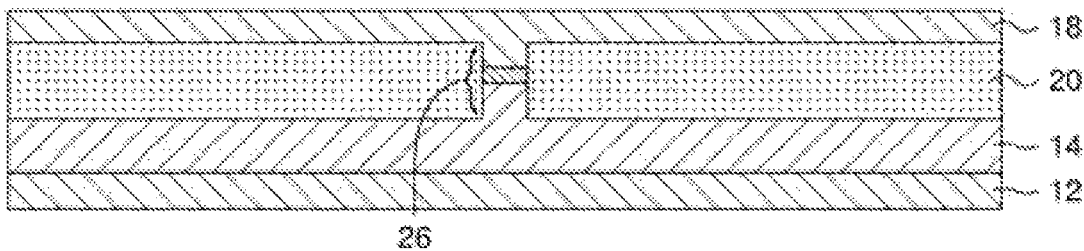
Figure 2E:
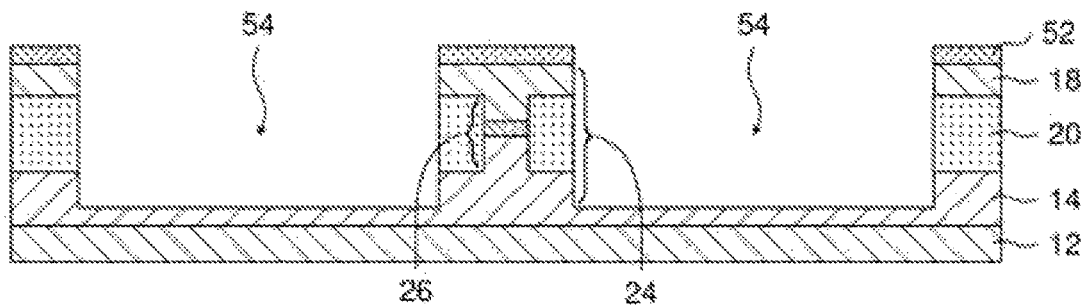

Then, as illustrated in FIG. 2(d), the second conductive type clad layer 18 is further grown on the ridge waveguide 26 and the current block layer 20. To grow the second conductive type clad layer 18, the second conductive type clad layer 18 is epitaxially grown after the mask 50 is removed with hydrofluoric acid such as buffered hydrofluoric acid.

Then, as illustrated in FIG. 2(e), two grooves 54 are formed to form the mesa 24. In this process, the two grooves 54 are formed by performing dry etching halfway to the first conductive type clad layer 14 from the upper surface of the second conductive type clad layer 18 using a mask 52. By this means, the mesa 24 on both sides of which the two grooves 54 are positioned is formed.

Figure 3A:
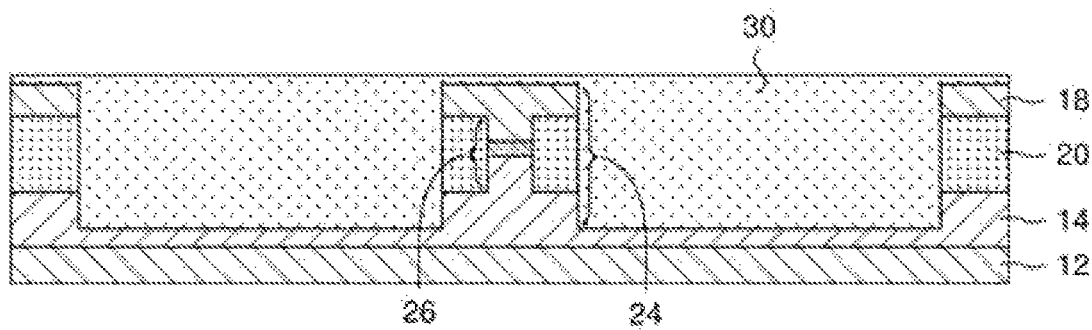

Then, as illustrated in FIG. 3(a), the mask 52 is removed from the state in FIG. 2(e), and the insulating resin film 30 is formed on the entire surface. The insulating resin film 30 is formed by first, applying an adhesion promotor, applying a non-photosensitive BCB resin which is an insulating resin on the adhesion promotor using a spin coating method to form a film, and performing thermosetting treatment. The insulating resin shrinks and deforms by polymerization reaction upon thermosetting treatment, and thus, a film thickness is designed in view of a shrinkage amount in advance. It is preferable to use a non-photosensitive BCB resin having low permittivity (for example, relative permittivity of 2.50 to 2.65) and having a small shrinkage amount upon thermosetting treatment as the insulating resin. The film thickness of the insulating resin film can be made, for example, from 1.0 μm to 26.0 μm by adjusting viscosity and the main rotational speed during spin coating. Further, while thermosetting treatment can be performed by heating at, for example, 250° C. to 350° C. at a bake furnace, it is necessary to perform heat treatment in an atmosphere of an inert gas such as nitrogen and argon so as to maintain oxide concentration at, for example, equal to or less than 100 ppm, because the insulating resin film is susceptible to oxidation during a heating-up period. It is necessary to form an electrode on the mesa 24 later, and thus, the thickness of the insulating resin film 30 on the mesa 24 is preferably equal to or less than 1.0 μm.

Figure 3B:
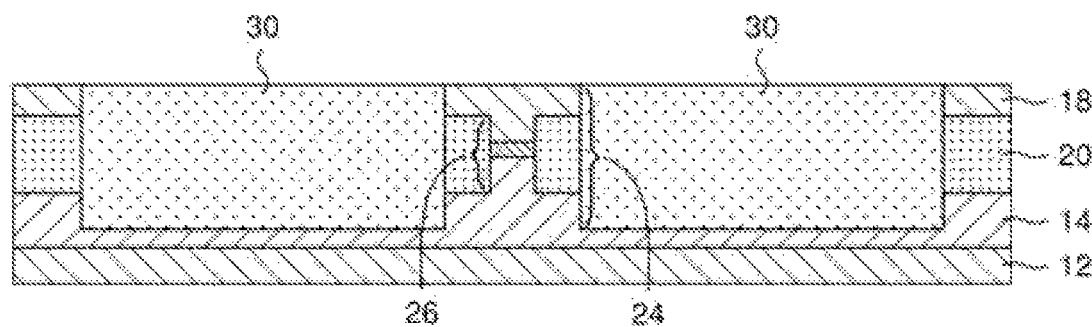

Then, as illustrated in FIG. 3(b), by exposing an upper surface of the mesa 24 by etching back the insulating resin film 30, the insulating resin film 30 embedded into each of the two grooves 54 on the both sides of the mesa 24 is formed. In a case where the BCB resin is used as the insulating resin, for example, plasma etching using a mixture gas of an oxygen gas and a fluorocarbon gas such as $CF_4$, $CHF_3$, $C_2F_6$, $C_3F_8$ and $C_4F_8$ can be applied as etching back.

Figure 3C:
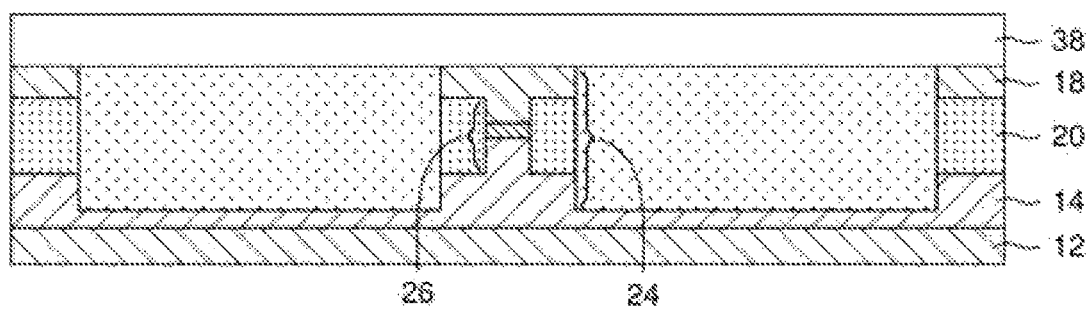

Then, as illustrated in FIG. 3(c), an insulating film 38 is formed on the insulating resin film 30 and the second conductive type clad layer 18. The insulating film 38 is formed using, for example, a chemical vapor deposition (CVD) method.

Figure 3D:
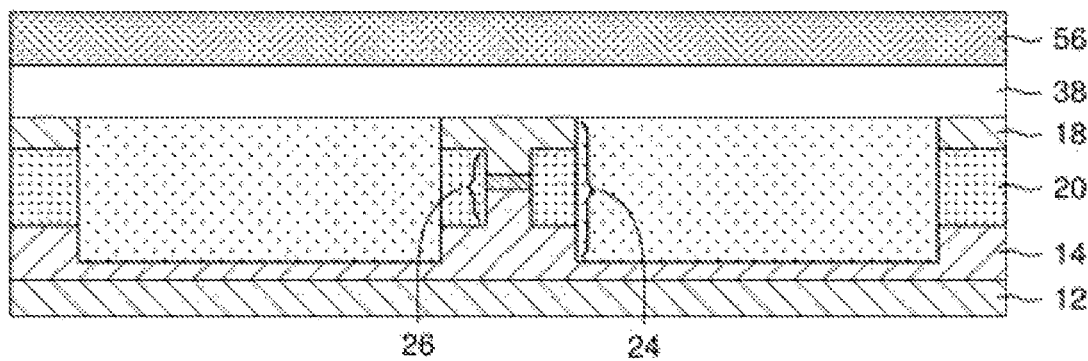

Then, as illustrated in FIG. 3(d), a photoresist 56 is formed. The photoresist 56 is formed by using, for example, a spin coating method, or the like. As the photoresist 56, a general positive resist for stepper exposure, a negative resist, or the like, can be used.

Figure 3E:
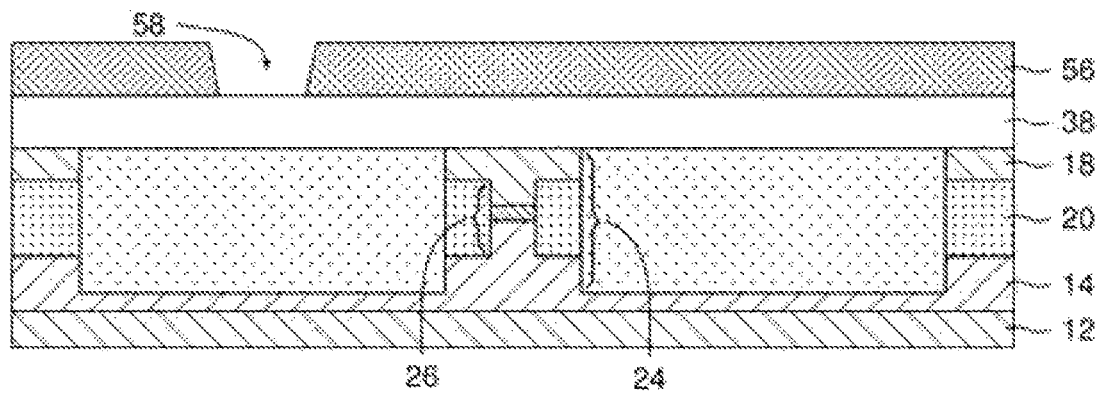

Then, as illustrated in FIG. 3(e), an opening pattern 58 is formed at the photoresist 56 on the insulating resin film 30 embedded in one of the two grooves 54 using a photolithography method.

Figure 4A:
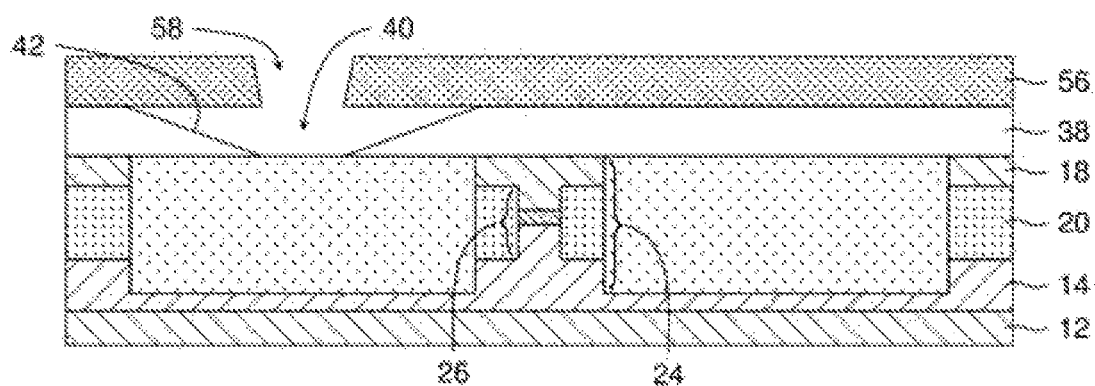

Then, as illustrated in FIG. 4(a), the second opening 40 is formed at the insulating film 38 under the opening pattern 58. The second opening 40 is formed through wet etching processing using a chemical of hydrofluoric acid. In this event, the second side surface 42 that is in contact with the second opening 40, of the insulating film 38 is inclined in the forward tapered direction, because the insulating film 38 is isotropically etched.

Figure 4B:
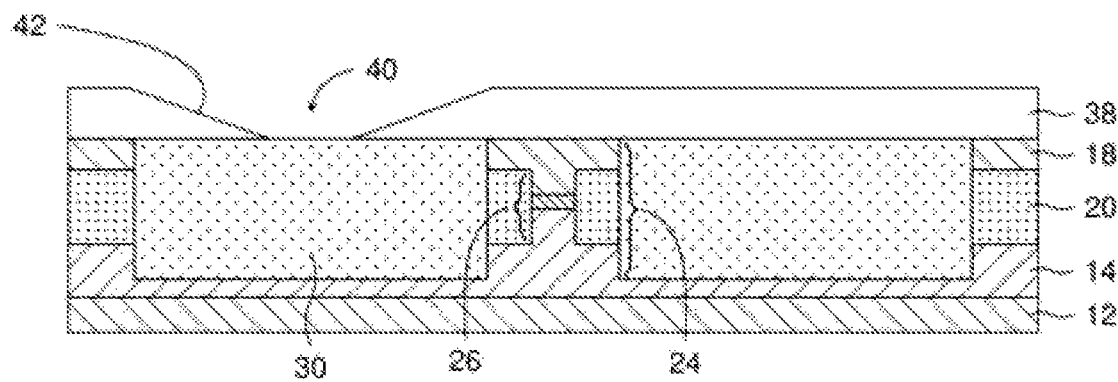

Then, as illustrated in FIG. 4(b), the photoresist 56 is removed. The photoresist 56 is removed using, for example, a stripper, oxygen ashing or the like. The photoresist 56 can be removed through processing continuous with etching of the insulating resin film 30 to be performed in the next process within the same chamber, which can simplify the process.

Figure 4C:
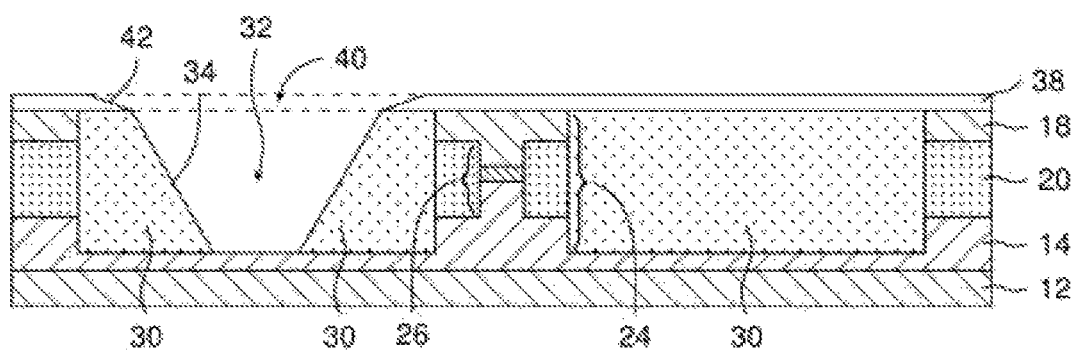

Then, as illustrated in FIG. 4(c), the first opening 32 is formed by etching the insulating resin film 30 under the second opening 40 so as to expose the first conductive type clad layer 14, so that the first side surface 34 that is in contact with the first opening 32, of the insulating resin film 30 is inclined in the forward tapered direction. The etching is performed using the insulating film 38 as a hard mask. As the etching, for example, plasma etching using a fluorocarbon gas and an oxygen gas can be used. In this event, a ratio of an etching rate ($R_{BCB}$) of the insulating resin film 30 and an etching rate ($R_{SiO}$) of the insulating film 38 ($R_{BCB}/R_{SiO}$, hereinafter, referred to as selectivity) can be adjusted by adjusting a mixture ratio of the fluorocarbon gas and the oxygen gas. Here, the insulating resin film 30 is etched while the selectivity is adjusted to approximately 4 by using a mixture gas of a $C_3F_8$ gas and an oxygen gas and making, for example, a mixture ratio of the oxygen gas 57%. By this means, the inclination of the insulating film 38 can be transferred to the insulating resin film 30. The insulating film 38 recedes by etching in this event, and the film thickness becomes thinner.

Figure 4D:
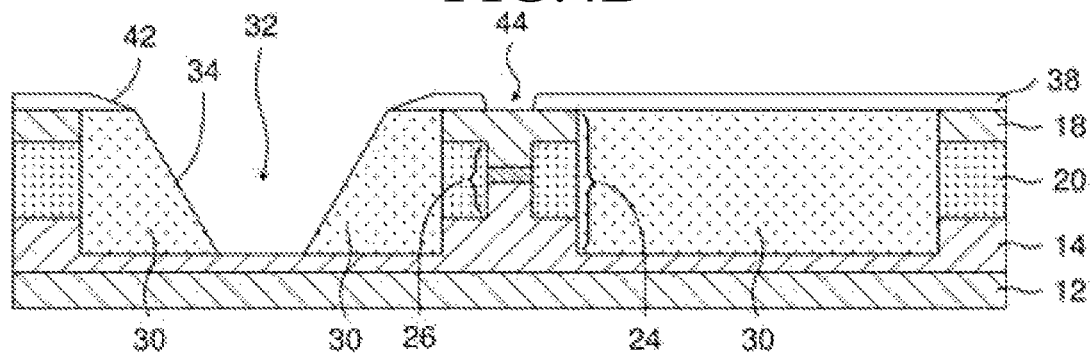

Then, as illustrated in FIG. 4(d), the third opening 44 is formed at the insulating film 38 on the mesa 24. To form the third opening 44, the photolithography method is performed again, and reactive ion etching including, for example, a fluorine gas is performed.

Then, the electrode 46 and the electrode 48 on the mesa are formed to obtain the semiconductor laser 10 in FIG. 1. To form these electrodes, for example, first, an opening pattern is formed using the photolithography method using an image reversal resist, a resist for liftoff, or the like. Then, an electrode having a laminate structure of Ti/Pt/Au is laminated on the entire surface of a wafer through vapor deposition or a sputtering method and is subjected to liftoff. By this means, the electrode is formed at a portion where the resist is open. The electrode 46 formed in this event is extracted onto the insulating film 38 along the first side surface 34 and the second side surface 42 that is inclined in the forward tapered direction.

Results of three experiments performed to confirm that the second side surface 42 of the insulating film 38 constituted with a silicon oxide film, and the first side surface 34 of the insulating resin film 30 constituted with BCB inclined in the forward tapered direction will be described.

Figure 5:
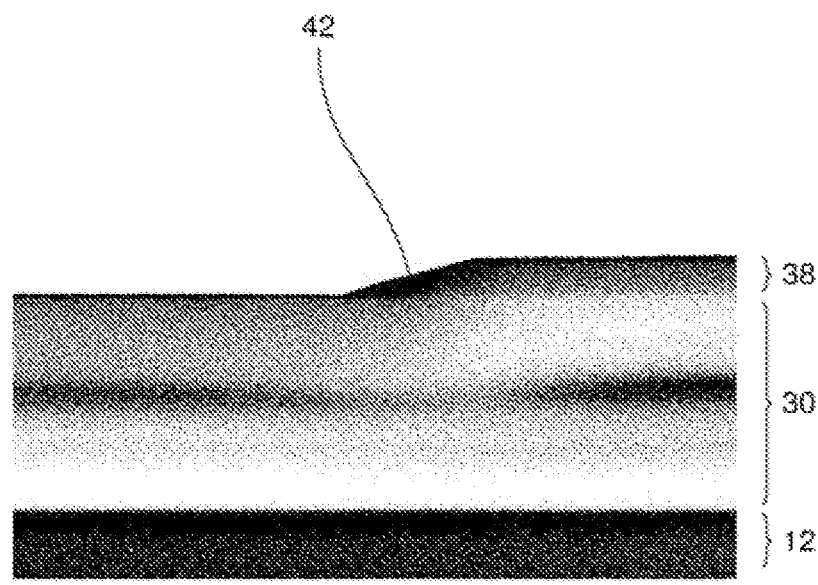
FIG. 5 is an SEM photograph showing the experimental result of etching of the insulating film according to the first embodiment.

In the first experiment, as illustrated in FIG. 5, it was confirmed that the second side surface 42 of the insulating film 38 inclined in the forward tapered direction. In this experiment, first, the insulating resin film 30 constituted with BCB and the insulating film 38 constituted with a silicon oxide film are prepared on the semiconductor substrate 12 constituted with semi-insulating MP. Then, a photoresist is formed on the insulating film 38, and further, an opening pattern is provided at the photoresist. Further, the insulating film 38 is wet etched using hydrofluoric acid. Finally, by removing the photoresist, a cross-sectional shape illustrated in FIG. 5 is obtained. An angle β formed by the second side surface 42 of the insulating film 38 and the upper surface of the insulating resin film 30 is equal to or less than 20°.

Figure 6A:
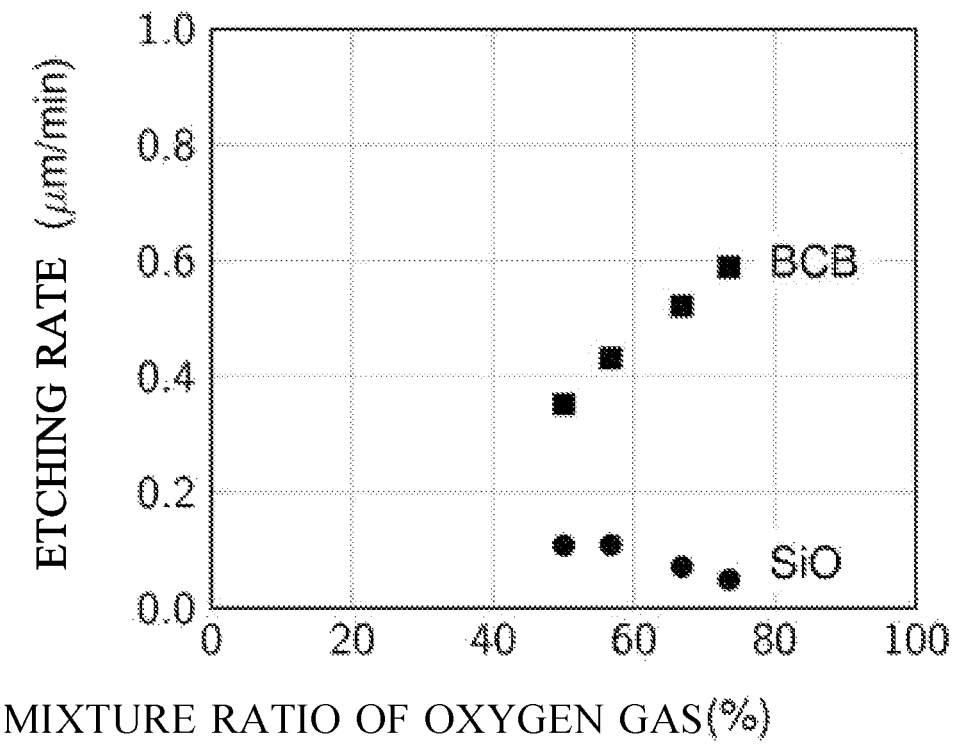
FIGS. 6A-6B are graphs showing the experimental result of the etching rate and the selectivity according to the first embodiment.
Figure 6B:
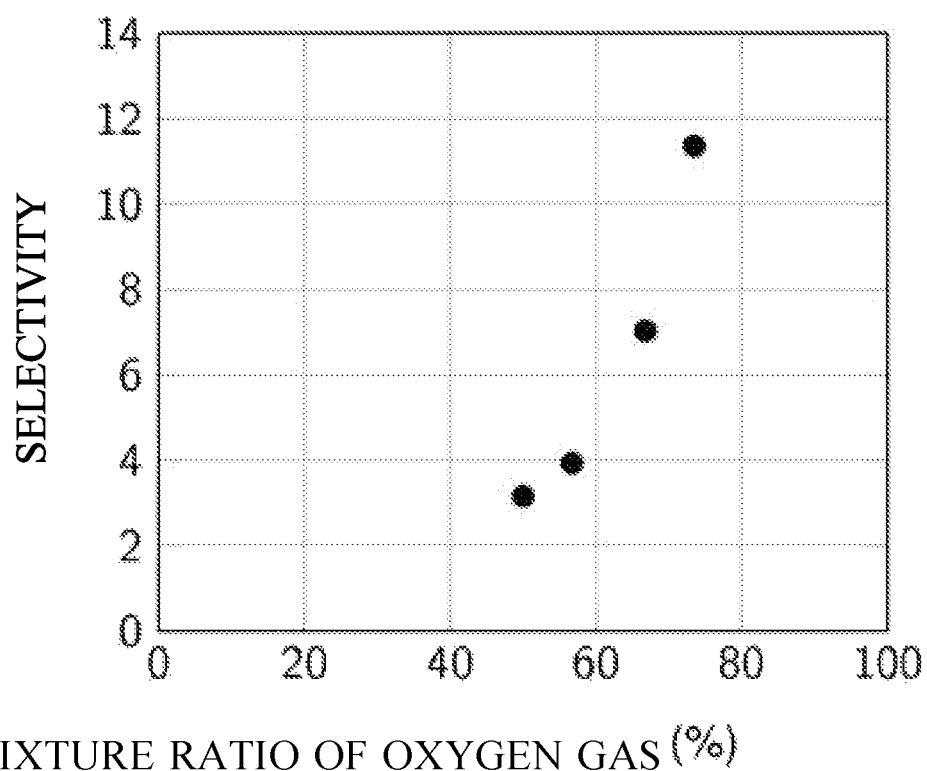

In the second experiment, as illustrated in FIG. 6, it was confirmed that the etching selectivity ($R_{BCB}/R_{SiO}$) of the BCB resin film and the silicon oxide film increased as the mixture ratio of the oxygen gas increases. In this experiment, plasma etching using the mixture gas of the $C_3F_8$ gas and the oxygen gas was performed in a similar manner to the process (FIG. 4(c)) of forming the first opening 32 described above, in this event, the selectivity was examined while changing the mixture ratio of the oxygen gas. As a result, it was found that the etching rates of the BCB and SiO were as indicated in FIG. 6(a). From this, as indicated in FIG. 6(b), it can be understood that the selectivity also increases as the mixture ratio of the oxygen gas increases.

In the third experiment, as illustrated in FIG. 7, the insulating resin film 30 was etched while changing the mixture ratio of the oxygen gas, and the first side surface 34 of the insulating resin film 30 was observed. Three conditions of 57%, 67% and 83% were provided for the mixture ratio of the oxygen gas. In this experiment, plasma etching was performed in the state in FIG. 5 obtained by the first experiment, in a similar manner to the second experiment.

Figure 7A:
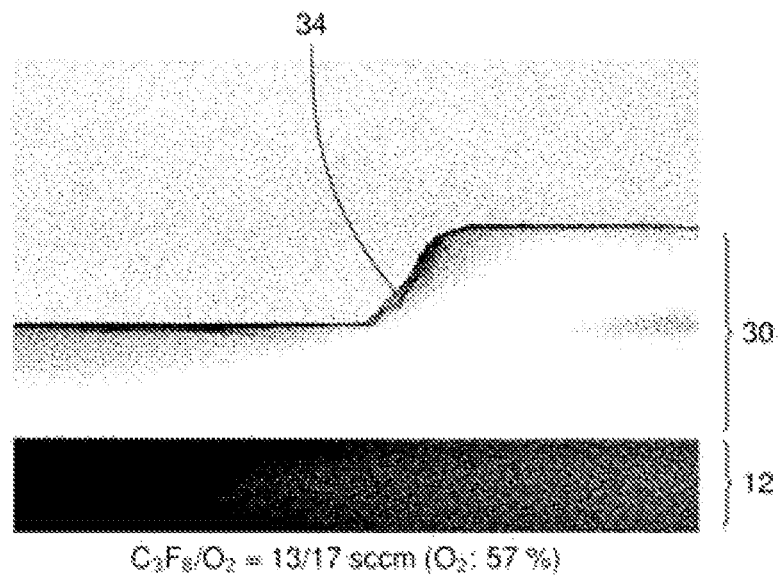
FIGS. 7A-7C are SEM photographs showing the experimental result of etching of the insulating resin film according to the first embodiment.

In the condition of the mixture ratio of 57%, as illustrated in FIG. 7(a), it was found that an inclination angle α of the insulating resin film 30 was approximately 55°, and neither fluff nor irregularities was conspicuous on the first side surface 34. This condition is appropriate for electrode formation.

Figure 7B:
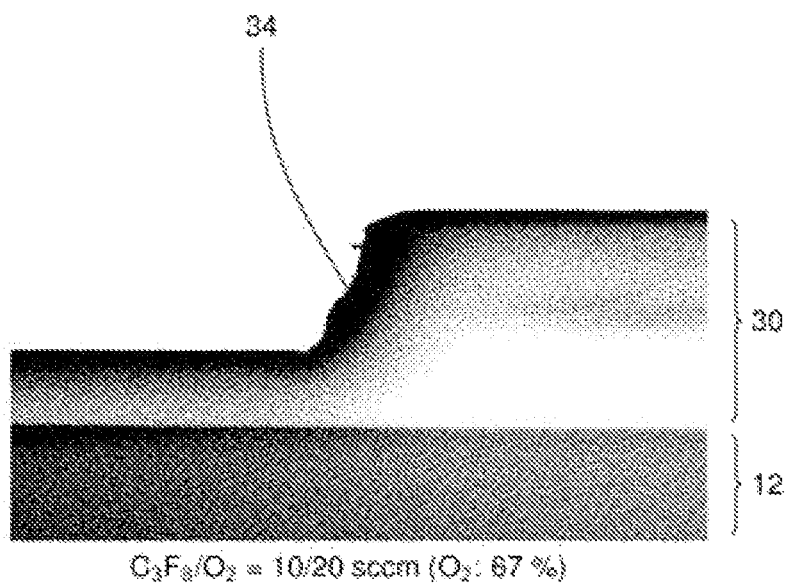

In the condition of the mixture ratio of 67%, as illustrated in FIG. 7(b), fluff and irregularities were conspicuous. Fine irregularities were formed on the second side surface 42 of the insulating film 38 due to wet etching. The irregularities are transferred to the first side surface 34 of the insulating resin film 30 when the insulating resin film 30 is etched. In a case of the mixture ratio of 57%, the etching selectivity was 4 as indicated in FIG. 6. On the other hand, in a case of the mixture ratio of 67%, the selectivity was 7.1. Thus, in a case of the mixture ratio of 67%, the irregularities are emphasized as a result of the first side surface 34 becoming steep, which makes it easier to cause fluff.

Figure 7C:
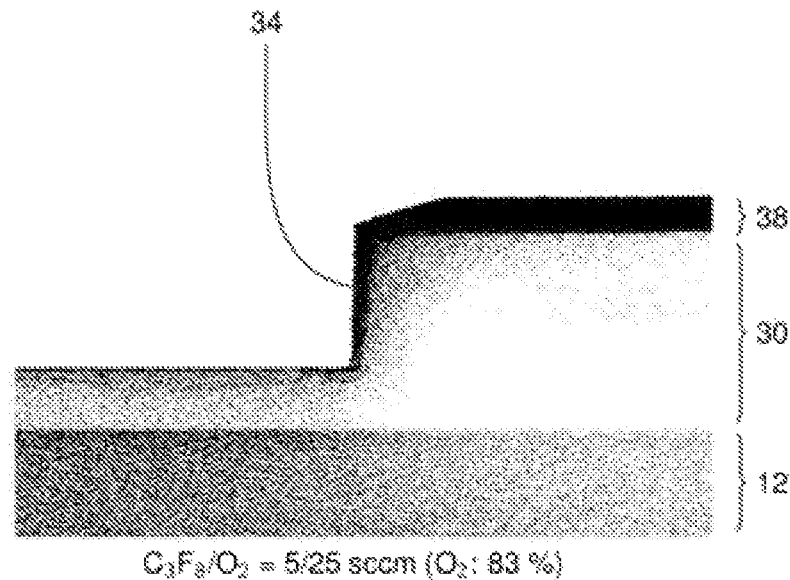

In the condition of the mixture ratio of 83%, as illustrated in FIG. 7(c), the first side surface 34 was substantially perpendicular. While the etching selectivity in a case of the mixture ratio of 83% is not indicated in FIG. 6, it is expected that the etching selectivity is high. In such a case, the first side surface 34 becomes substantially perpendicular, although irregularities are not formed on the first side surface 34. In other words, the first side surface 34 is not inclined in the forward taper direction.

The selectivity only requires to be around 4 and is, specifically, preferably 3 to 5. Making the selectivity smaller provides an advantage of making irregularities further less likely to be formed. However, making the selectivity smaller also provides a disadvantage that it is necessary to make the insulating film 38 thicker, or the like. In view of this, the selectivity is preferably 3 to 5.

Figure 8:
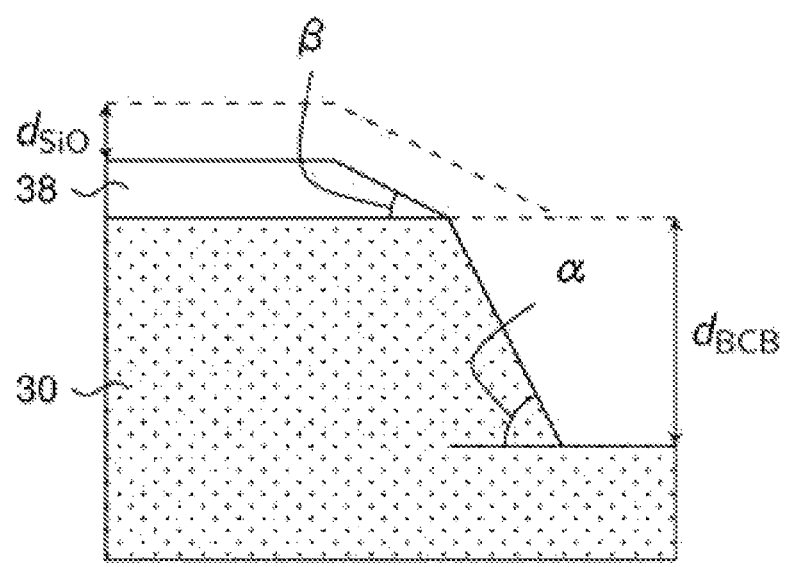
FIG. 8 is a diagram to describe the inclination angles of the insulating film and the insulating resin film due to etching according to the first embodiment.

If the selectivity is 3 to 5, a relationship of $3 \leq \tan \alpha/\tan \beta \leq 5$ is provided between the inclination angle α of the first side surface of the insulating resin film and the inclination angle β of the second side surface of the insulating film. This relationship will be described using FIG. 8 that schematically illustrates an aspect of etching for forming the first opening 32. Both of the insulating film 38 and the insulating resin film 30 are scraped through etching. The etching rate of the insulating resin film 30 is $R_{BCB}$, and the etching rate of the insulating film 38 is $R_{SiO}$. Assuming that lengths in a vertical direction that the insulating film 38 and the insulating resin film 30 are scraped in a certain period are respectively $d_{SiO}$ and $d_{BCB}$, $d_{SiO}$ is proportional to $R_{SiO}$, and $d_{BCB}$ is proportional to $R_{BCB}$. Then, a relationship of $R_{SiO}/R_{BCB} = \tan \alpha/\tan \beta$ holds. It can be said that $R=R_{SiO}/R_{BCB} = \tan \alpha/\tan \beta$, because $R_{SiO}/R_{BCB}$ is the etching selectivity R. From this, if $3 \leq R \leq 5$, $3 \leq \tan \alpha/\tan \beta \leq 5$ holds.

As described above, according to the first embodiment, the insulating resin film 30 is embedded in the grooves 54 on the both sides of the mesa 24, and the electrode 46 connected to the first conductive type clad layer 14 is extracted from the surface side, so that a semiconductor device which achieves reduction in parasitic capacitance of electrodes can be obtained. The insulating resin film typically has lower permittivity than permittivity of a semiconductor material and an insulating film such as a silicon oxide film and a silicon nitride film, and thus, by forming the insulating resin film on the both sides of the mesa 24, parasitic capacitance of the electrodes can be reduced. Further, by employing a surface-mounted semiconductor laser in which the electrode 46 is extracted on the surface side, parasitic capacitance can also be reduced.

Still further, the first side surface 34 of the insulating resin film 30 and the second side surface 42 of the insulating film 38 inclined in the forward tapered direction, and thus, a bending angle of the electrode 46 while the electrode 46 is extracted from the bottom surface 36 of the first opening 32 onto the insulating film 38 becomes obtuse, so that it is possible to prevent peeling and disconnection of the electrode 46.

Further, inclination angles (a and P) of the first side surface 34 and the second side surface 42 less vary. The second surface 42 is formed by isotropically wet etching the insulating film 38, so that the inclination angle less varies. On the first side surface 34, the inclination of the second side surface 42 is transferred in accordance with the etching selectivity of the insulating resin film 30 and the insulating film 38, so that the inclination angle less varies. Thus, the inclination angle does not become steep by mistake, so that it is possible to prevent peeling and disconnection of the electrode 46.

Figure 9:
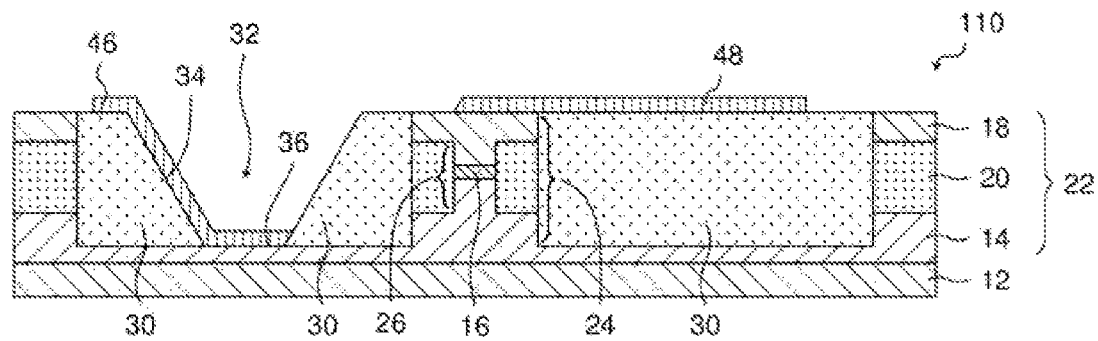
FIG. 9 is a cross-sectional diagram describing a modification of the semiconductor device according to the first embodiment.

Note that while in the first embodiment, the insulating film 38 is left without being removed, the insulating film may be removed as in FIG. 9. The insulating film is removed before the electrode 46 and the electrode 48 on the mesa are formed. In this drawing, the electrode 46 is extracted onto the insulating resin film 30. There is a case where removal of the insulating film 38 can prevent deterioration of adhesion of an electrode, or the like. The insulating film 38 may remain on an upper layer as a reaction product depending on etching conditions, and thus, in a case where the insulating film 38 is not removed, the insulating film 38 can be a cause of deterioration of adhesion when an electrode, or the like, is formed later. Removal of the insulating film 38 can eliminate this concern.

Figure 10:
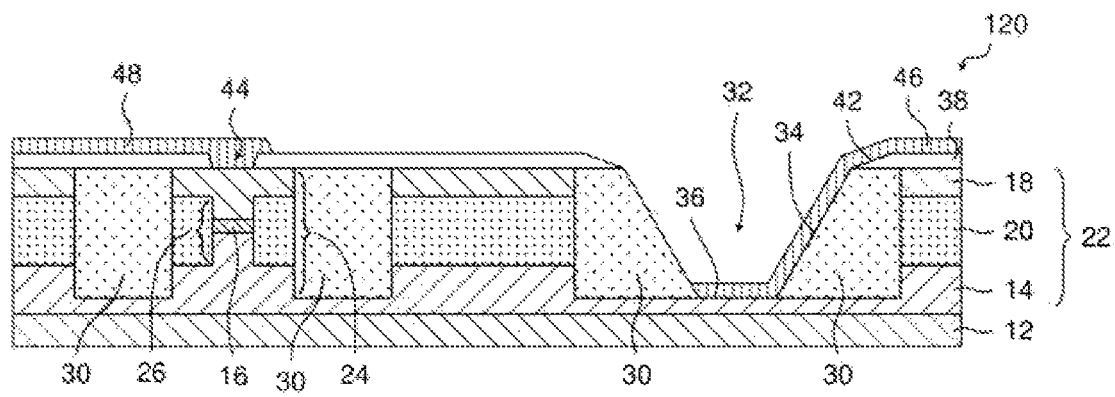
FIG. 10 is a cross-sectional diagram describing another modification of the semiconductor device according to the first embodiment.

Further, while the two grooves 54 are formed on the both sides of the mesa 24 in this embodiment, three or more grooves may be formed. In other words, two or more grooves 54 are formed at the laminate 22. Further, two grooves among the two or more grooves 54 are positioned on the both sides of the mesa 24. FIG. 10 illustrates a case where three grooves are formed. In this drawing, the electrode 46 is provided in the groove 32 located away from the both sides of the mesa 24.

Further, here, the first conductive type and the second conductive type are either a p-type or an n-type of the semiconductor and are conductive types different from each other. For example, in a case where the first conductive type is a p-type, the second conductive type is an n-type, and in a case where the first conductive type is an n-type, the second conductive type is a p-type.

Second Embodiment

A semiconductor device according to the second embodiment will be described. While in the first embodiment, the semiconductor device is a semiconductor laser, in the second embodiment, the semiconductor device is a Mach-Zehnder phase modulator. Here, differences from the first embodiment will be mainly described.

Figure 11:
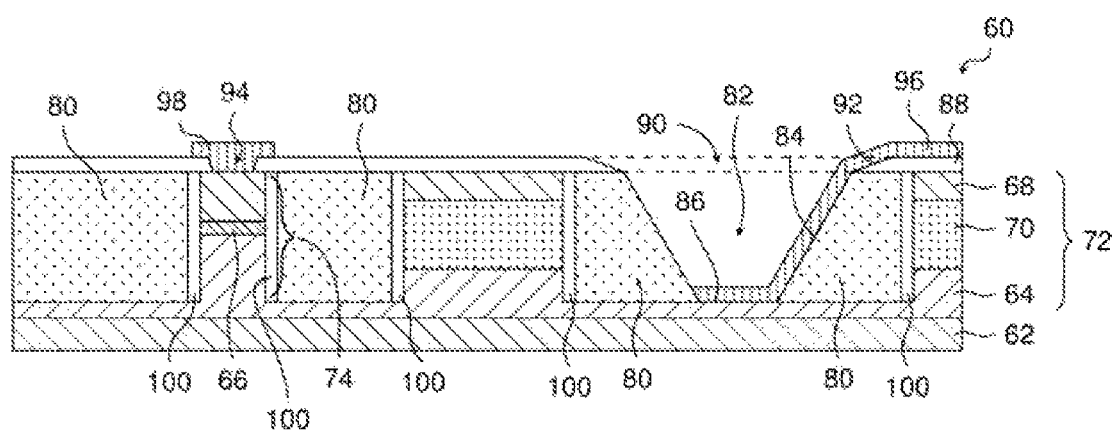
FIG. 11 is a cross-sectional diagram describing the semiconductor device according to the second embodiment.
Figure 12:
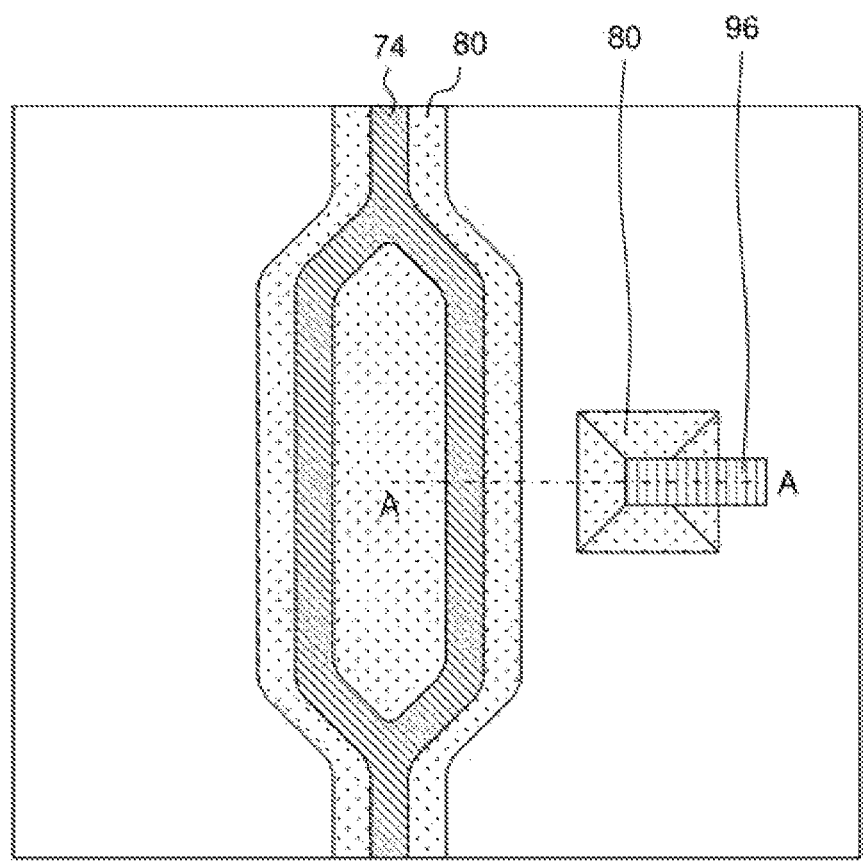
FIG. 12 is a top view describing the semiconductor device according to the second embodiment.

A configuration of the semiconductor device according to the second embodiment will be described. The semiconductor device according to the second embodiment is a Mach-Zehnder phase modulator 60 illustrated in FIG. 11. FIG. 11 is a cross-sectional diagram cut along A-A in a top view of the Mach-Zehnder phase modulator 60 illustrated in FIG. 12. Note that illustration of an electrode 98 on the mesa, an insulating film 88, and the like, is omitted in FIG. 12 for description.

As illustrated in FIG. 11, the Mach-Zehnder phase modulator 60 includes a semiconductor substrate 62.

A first conductive type clad layer 64 is formed on the semiconductor substrate 62.

A mesa 74 in which the first conductive type clad layer 64, an active layer 66 and a second conductive type clad layer 68 are formed sequentially from the bottom, is formed. The active layer 66 includes, for example, a multiple quantum well structure including i-type AlGaInAs. The second conductive type clad layer 68 includes, for example, p-type InP. The mesa 74 also functions as a ridge waveguide having a high mesa structure. In other words, the mesa 74 includes a ridge waveguide.

Grooves 104 are formed at a laminate 72 constituted with the first conductive type clad layer 64 as a lowermost layer and the second conductive type clad layer 68 as an uppermost layer. Positions of the grooves 104 are illustrated in FIG. 14(b) that illustrates a manufacturing process. An intermediate layer between the first conductive type clad layer 64 and the second conductive type clad layer 68 of the laminate 72 is the active layer 66 in the mesa 74 and is a current block layer 70 in a portion other than the mesa 74. A total of three grooves 104 are dug on both sides of the mesa 74 and at a portion away from the both sides of the mesa 74. The grooves 104 are dug halfway to the first conductive type clad layer 64 from an upper surface of the second conductive type clad layer 68. A protective insulating film 100 is formed on a side wall of the laminate 72. The protective insulating film 100 is constituted with, for example, a silicon oxide film or a silicon nitride film. The protective insulating film 100 is provided for the purpose of protecting the mesa 74 from intrusion of moisture. To achieve this purpose, the protective insulating film 100 is preferably a silicon nitride film. However, the protective insulating film 100 does not have to be provided. An insulating resin film 80 is embedded in the grooves 104.

Among the grooves 104, a first opening 82 is open at the groove located at a portion away from the both sides of the mesa 74. A first side surface 84 is inclined in the forward tapered direction.

The insulating film 88 is formed on the insulating resin film 80 and the second conductive type clad layer 68. A second opening 90 is formed at the insulating film 88. FIG. 11 indicates a position of the second opening 90 with a dashed line. A side surface (second side surface 92) that is in contact with the second opening 90, of the insulating film 88, that is, the second side surface 92 that is continuous with the first side surface 84, of the insulating film 88 is inclined in the forward tapered direction.

An electrode 96 connected to the first conductive type clad layer 64 on the bottom surface 86 is formed.

The electrode 98 on the mesa is formed on the mesa 74.

A method for manufacturing the Mach-Zehnder phase modulator 60 will be described using FIG. 13 to FIG. 14.

Figure 13A:
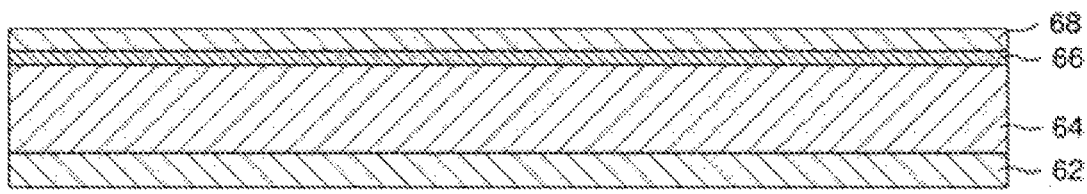
FIGS. 13A-13C and 14A-14C are cross-sectional diagrams to describe the method for manufacturing the semiconductor device according to the second embodiment.

First, as illustrated in FIG. 13(a), the first conductive type clad layer 64, the active layer 66 and the second conductive type clad layer 68 are sequentially formed on the semiconductor substrate 62.

Figure 13B:
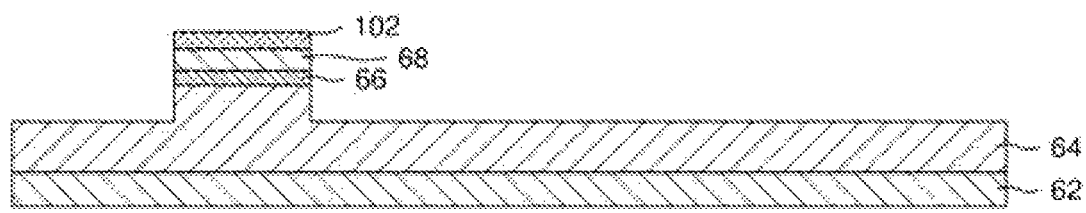

Then, as illustrated in FIG. 13(b), etching is performed using a mask 102. In this process, dry etching is performed halfway to the first conductive type clad layer 64 from an upper surface of the second conductive type clad layer 68.

Figure 13C:
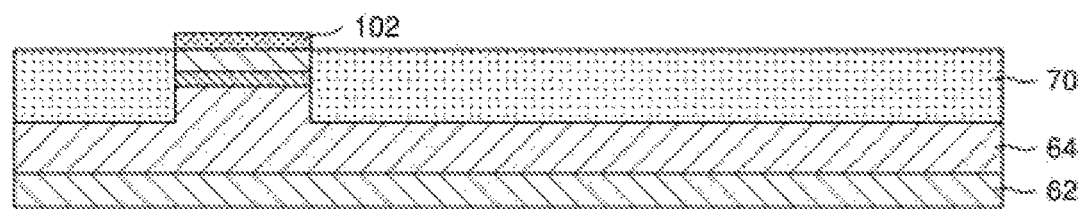

Then, as illustrated in FIG. 13(c), the current block layer 70 is embedded. To embed with the current block layer 70, the current block layer 70 is selectively epitaxially grown using the mask 102. In this event, the current block layer 70 is embedded to the upper surface of the second conductive type clad layer 68.

Figure 14A:
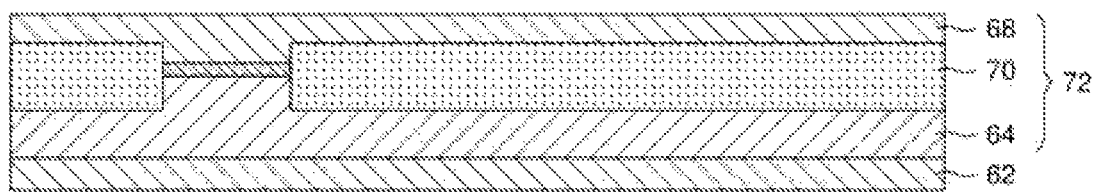
Figure 14B:
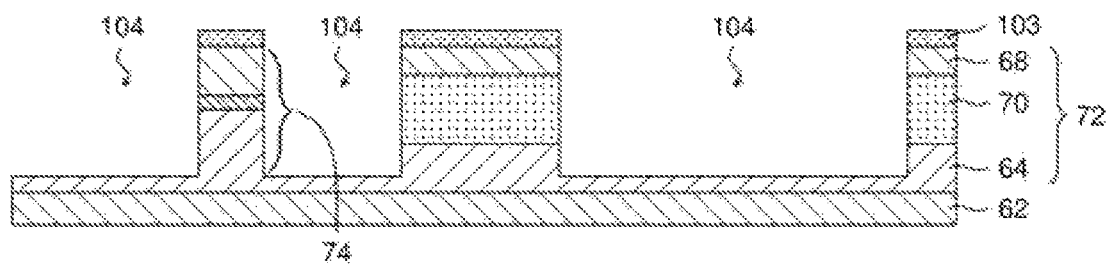

Then, as illustrated in FIG. 14(a), the second conductive type clad layer 68 is further grown. To grow the second conductive type clad layer 68, the second conductive type clad layer 68 is epitaxially grown after the mask 102 is removed using hydrofluoric acid such as buffered hydrofluoric acid. Through this process, the laminate 72 is formed.

Then, as illustrated in FIG. 14(b), three grooves 104 are formed, and thereby the mesa 74 is formed. In this process, the three grooves 104 are formed by performing dry etching halfway to the first conductive type clad layer 64 from the upper surface of the second conductive type clad layer 68 using a mask 103. By this means, the mesa 74 on both sides of which two grooves 104 among the three grooves 104 are positioned is formed.

Figure 14C:
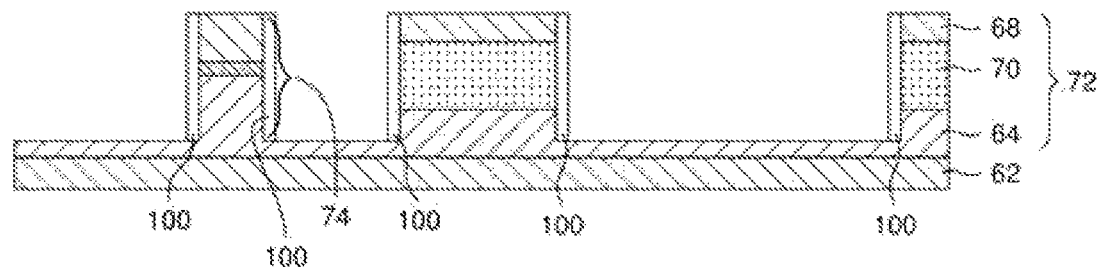

Then, as illustrated in FIG. 14(c), the protective insulating film 100 is formed by forming a silicon nitride film on the entire surface using, for example, a CVD method and then etching back the silicon nitride film through dry etching while leaving the silicon nitride film on the side wall of the laminate 72. As the dry etching, for example, reactive ion etching using a fluorine gas such as $CF_4$ and $CHF_3$ can be used. In this event, etching is preferably performed at a low pressure, specifically, at equal to or less than 0.5 Pa to prevent loss of the silicon nitride film on the side wall through side etching.

After this, processes similar to the processes in the first embodiment are performed, and thereby, the Mach-Zehnder phase modulator in FIG. 11 is obtained. Specifically, processes similar to the processes from FIG. 3(a) to FIG. 4(d) and the processes from FIG. 4(d) to FIG. 1 in the first embodiment are performed. However, while in the first embodiment, the first opening 32 is open at the insulating resin film 30 formed on a side of the mesa 24 as illustrated in FIG. 1, in this the second embodiment, the first opening 82 is open at the groove 104 positioned away from the both sides of the mesa 74 as illustrated in FIG. 11.

As described above, according to the second embodiment, it is possible to obtain a semiconductor device that achieves reduction in parasitic capacitance of electrodes and makes peeling and disconnection of electrodes less likely to occur.

Figure 15:
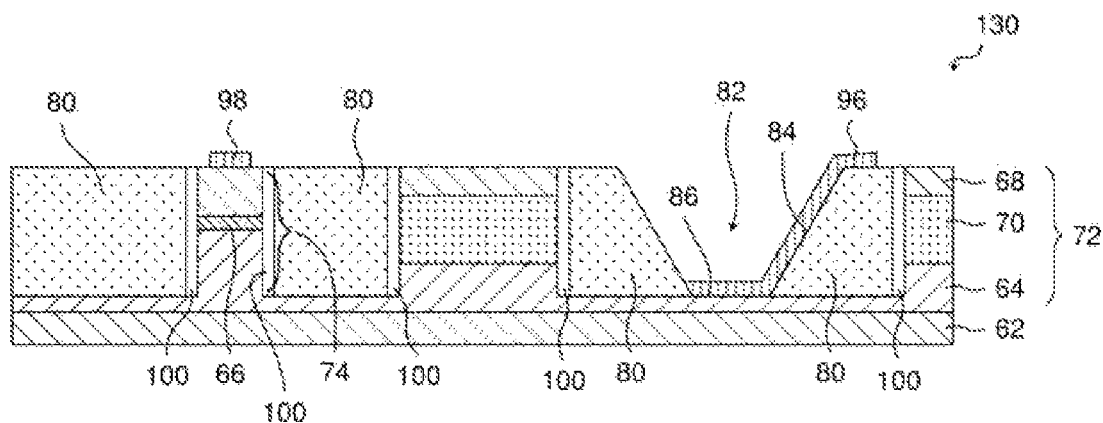
FIG. 15 is a cross-sectional diagram describing a modification of the semiconductor device according to the second embodiment.

Note that the insulating film may be removed as in FIG. 15. Removal of the insulating film can prevent deterioration of adhesion of an electrode, or the like, in a similar manner to the first embodiment.

Figure 16:
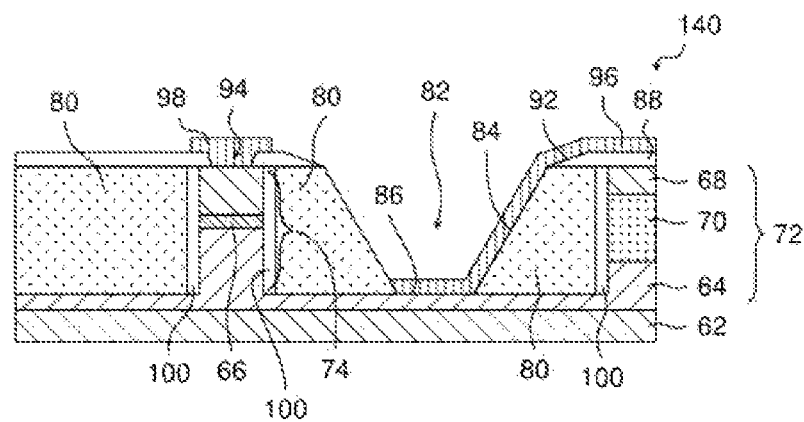
FIG. 16 is a cross-sectional diagram describing another modification of the semiconductor device according to the second embodiment.

Further, while three grooves 104 are formed in this embodiment, it is only necessary that at least two grooves are formed on the both sides of the mesa 74. In other words, two or more grooves 104 are formed at the laminate 72. Further, two grooves among the two or more grooves 104 are formed on the both sides of the mesa 74. FIG. 16 illustrates a case where two grooves are formed. In this drawing, the electrode 96 is provided at one of the grooves on the both sides of the mesa 74.

REFERENCE SIGNS LIST 10, 110, 120 semiconductor laser
12, 62 semiconductor substrate
14, 64 first conductive type clad layer
16, 66 active layer
18, 68 second conductive type clad layer
20, 70 current block layer
22, 72 laminate
24, 74 mesa
26, 76 ridge waveguide
30, 80 insulating resin film
32, 82 first opening
34, 84 first side surface
36, 86 bottom surface
38, 88 insulating film
40, 90 second opening
42, 92 second side surface
44, 94 third opening
46, 96 electrode
48,98 electrode on mesa
50, 102, 52, 103 mask
54, 104 groove
56 photoresist
58 opening pattern
60, 130, 140 Mach-Zehnder phase modulator
100 protective insulating film

The invention claimed is:

1. A semiconductor device comprising:
   a semiconductor substrate;
   a laminate formed on the semiconductor substrate and including a first conductive type clad layer as a lowermost layer and a second conductive type clad layer as an uppermost layer, two or more grooves that are dug halfway to the first conductive type clad layer from an upper surface of the second conductive type clad layer being formed in the laminate;
   a mesa including a ridge waveguide including the first conductive type clad layer, an active layer and the second conductive type clad layer sequentially from a side closer to the semiconductor substrate, two grooves among the two or more grooves being positioned on both sides of the mesa; and
   an insulating resin film embedded into the two or more grooves,
   wherein a first opening having a bottom surface from which the first conductive type clad layer is exposed is formed at the insulating resin film embedded in one of the two or more grooves,
   an electrode connected to the first conductive type clad layer on the bottom surface and extracted above the insulating resin film along a first side surface that is in contact with the first opening, of the insulating resin film is formed,
   the first side surface is inclined in a forward tapered direction
   an insulating film is formed on the insulating resin film and the second conductive type clad layer,
   a second side surface that is continuous with the first side surface, of the insulating film is inclined in a forward tapered direction, and
   the electrode is extracted onto the insulating film along the second side surface.

2. The semiconductor device according to claim 1, wherein assuming that an angle formed by the first side surface and a lower surface of the insulating resin film is α,
   20°≤α≤60° is satisfied.

3. The semiconductor device according to claim 1, wherein assuming that an angle formed by the first side surface and a lower surface of the insulating resin film is α, and
   an angle formed by the second side surface and an upper surface of the insulating resin film is β,
   3≤tan α/tan β≤5 is satisfied.

4. The semiconductor device according to claim 1, wherein the insulating resin film includes BCB or a polyimide resin.

5. The semiconductor device according to claim 1, wherein the ridge waveguide is a resonator of a semiconductor laser.

6. The semiconductor device according to claim 1, wherein the ridge waveguide is a modulation waveguide of a Mach-Zehnder phase modulator.

7. A method for manufacturing a semiconductor device, comprising:
   sequentially forming a first conductive type clad layer, an active layer and a second conductive type clad layer on a semiconductor substrate;
   forming two or more grooves by performing etching halfway to the first conductive type clad layer from an upper surface of the second conductive type clad layer to form a mesa including a ridge waveguide including the first conductive type clad layer, the active layer and the second conductive type clad layer from a side closer to the semiconductor substrate, two grooves among the two or more grooves being positioned on both sides of the mesa;
   forming an insulating resin film to be embedded into the two or more grooves;
   forming an insulating film on the insulating resin film and the second conductive type clad layer;

forming a second opening by etching the insulating film on the insulating resin film embedded into one groove among the two or more grooves and tilting a second side surface that is in contact with the second opening, of the insulating film in a forward tapered direction;

forming a first opening by etching the insulating resin film under the second opening using the insulating film as a mask so that the first conductive type clad layer is exposed and tilting a first side surface that is in contact with the first opening, of the insulating resin film in a forward tapered direction; and forming an electrode connected to the first conductive type clad layer on a bottom surface of the first opening and extracted above the insulating resin film along the first side surface.

8. The method for manufacturing the semiconductor device according to claim 7, comprising:

removing the insulating film between tilting the first side surface in the forward tapered direction and forming the electrode.

* * * * *